(12) United States Patent
Roesner et al.

(10) Patent No.: US 6,958,916 B2
(45) Date of Patent: Oct. 25, 2005

(54) RACKMOUNT COMPUTER SYSTEM AND METHOD

(75) Inventors: Arlen L. Roesner, Fort Collins, CO (US); Tillman Frazier Taylor, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 70 days.

(21) Appl. No.: 10/374,161

(22) Filed: Feb. 24, 2003

(65) Prior Publication Data

US 2004/0165360 A1 Aug. 26, 2004

(51) Int. Cl.7 .......................... H01R 12/16; H05K 7/00
(52) U.S. Cl. ...................... 361/790; 361/728; 361/735; 361/785; 361/788
(58) Field of Search ................... 361/683, 686, 361/724–728, 730–732, 735–737, 740, 747–748, 752, 756, 759, 785, 788, 790, 796, 801, 802

(56) References Cited

U.S. PATENT DOCUMENTS

| 5,831,821 A | 11/1998 | Scholder et al. | |
|---|---|---|---|
| 6,118,668 A | 9/2000 | Scholder et al. | |
| 6,657,867 B2 | * 12/2003 | Smith | ......................... 361/725 |
| 2002/0122293 A1 | * 9/2002 | Kohler et al. | ............... 361/683 |

* cited by examiner

*Primary Examiner*—Phuong T. Vu

(57) ABSTRACT

A rackmount computer system comprises a 2U rackmount chassis. The system also comprises a card cage adapted to receive at least four vertically stacked and horizontally oriented cards. The card cage is insertable into the 2U rackmount chassis.

26 Claims, 5 Drawing Sheets

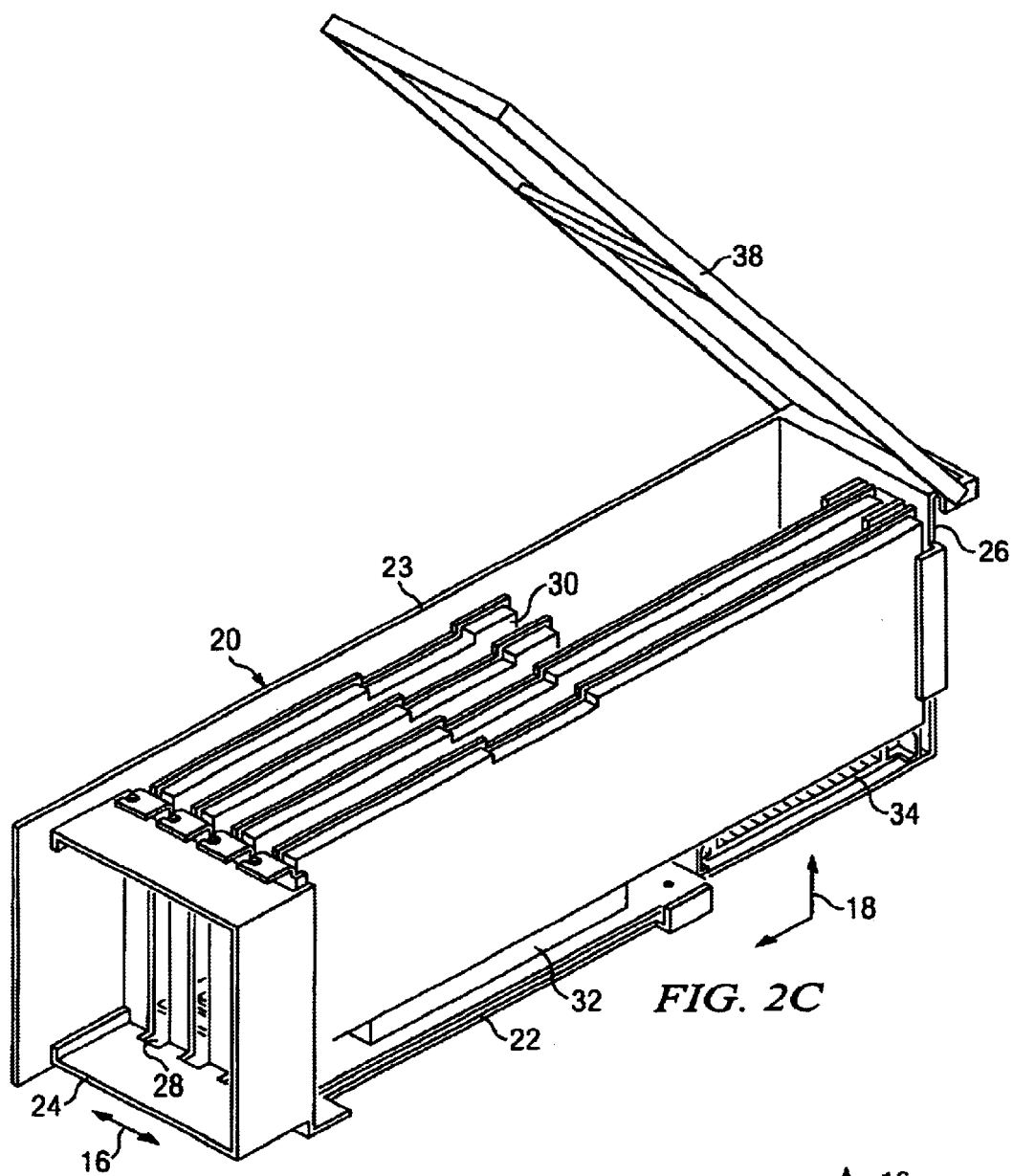
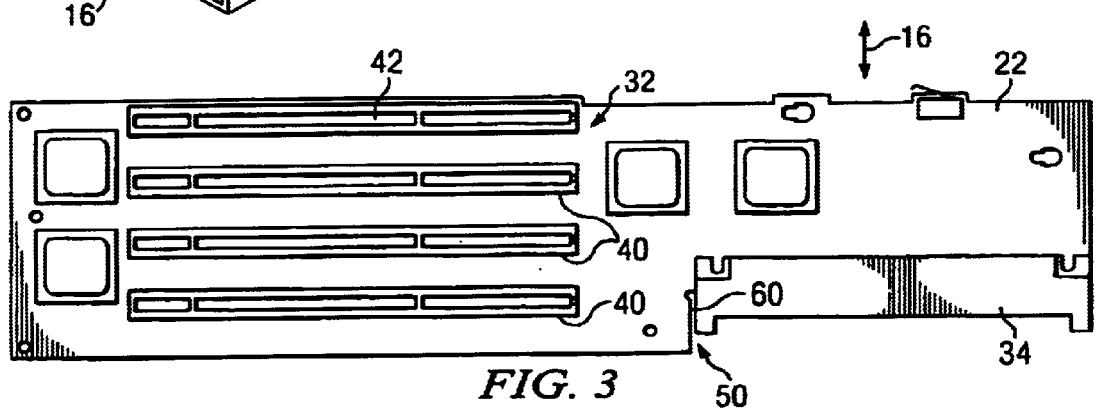

RACKMOUNT COMPUTER SYSTEM AND METHOD

TECHNICAL FIELD OF THE INVENTION

The present invention relates generally to the field of computer systems and, more particularly, to a rackmount computer system and method.

BACKGROUND OF THE INVENTION

Rackmount computer systems are generally designed having a height corresponding to whole multiples of an industry standard rack mounting height dimension. For example, rackmount systems are generally referred to as 2U, 3U, 4U, etc., systems where the "U" designation refers to one dimensional increment of 1.75" in height along the vertical members of an Electronics Industry Alliance (EIA) industry-standard computer racking structure. Thus, a 2U rackmount system is generally designed to be approximately 3.5" in height, less a small amount of clearance between vertically-adjacent rackmounted systems located in such a rack.

However, as the level of sophistication and operational requirements for electronic equipment increases, an increase in the quantity of components that may be installed into a particular rackmount system is also desired. Thus, a greater quantity of drives, peripheral component interconnect (PCI) cards, and other types of components than the quantity generally associated with a particular industry-standard mounting height 'U' designation may be desired in the rackmount system. However, because of the density of the components in the rackmount system and the size limitations of a particular U-designated rackmount system, the quantity of components that may be placed in a particular rackmount system is generally limited. Presently, for example, a 2U rackmount system can accommodate at most two vertically stacked drives and at most three vertically stacked PCI or expansion cards.

SUMMARY OF THE INVENTION

In accordance with one embodiment of the present invention, a rackmount computer system comprises a 2U rackmount chassis. The system also comprises a card cage adapted to receive at least four vertically stacked horizontally oriented cards. The card cage is insertable into the 2U rackmount chassis.

In accordance with another embodiment of the present invention, a method for providing a rackmount computer system comprises providing a 2U rackmount chassis and providing a card cage adapted to receive at least four vertically stacked horizontally oriented cards. The card cage is insertable into the 2U rackmount chassis.

BRIEF DESCRIPTION OF THE DRAWINGS

For a more complete understanding of the present invention and the advantages thereof, reference is now made to the following descriptions taken in connection with the accompanying drawings in which:

FIGS. 2A–2C are diagrams illustrating an embodiment of a card cage of the rackmount computer system of FIG. 1;

FIG. 3 is a diagram illustrating a profile view of the embodiment of the card cage in FIGS. 2A–2C;

DETAILED DESCRIPTION OF THE DRAWINGS

The preferred embodiments of the present invention and the advantages thereof are best understood by referring to FIGS. 1–5 of the drawings, like numerals being used for like and corresponding parts of the various drawings.

Figure 1:
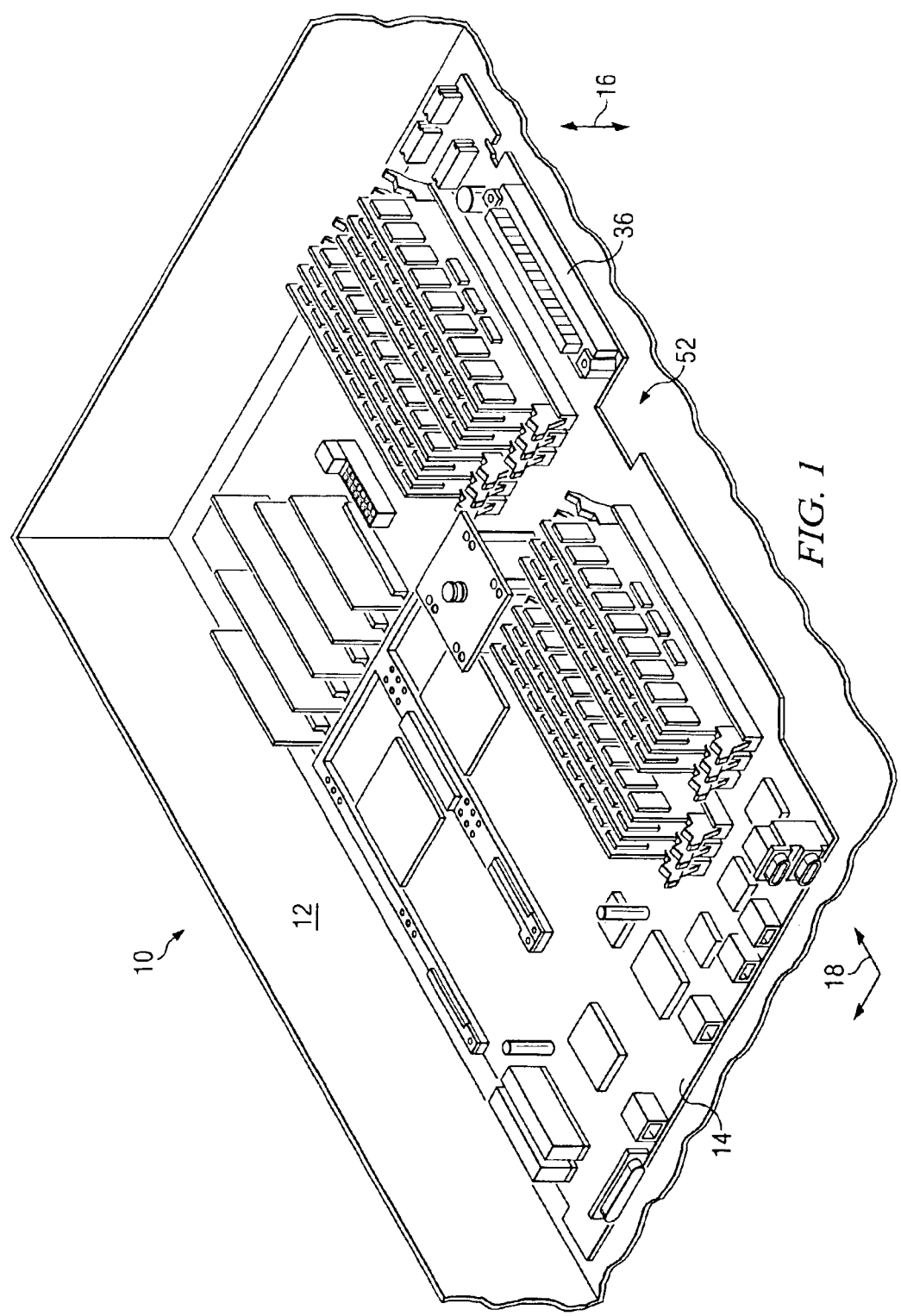
FIG. 1 is a diagram illustrating an embodiment of a rackmount computer system in accordance with the present invention.

FIG. 1 is a diagram illustrating an embodiment of a rackmount computer system 10 in accordance with the present invention. In the illustrated embodiment, system 10 comprises a 2U rackmount chassis 12 for housing various types of electronic components such as, but not limited to, fan or cooling assemblies, disk drives, and, as illustrated in FIG. 1, a motherboard 14. As will be described in greater detail below, system 10 is adapted to receive four vertically stacked and horizontally oriented peripheral component interconnect (PCI) or expansion cards within the 2U rack dimension. As used herein, the terms "vertical" or "vertically" shall refer to the direction indicated generally at 16 in FIG. 1 relative to chassis 12, also coinciding with the 2U rack dimension standard direction, and the terms "horizontal" or "horizontally" shall refer to the directions indicated generally at 18 in FIG. 1 relative to chassis 12.

Figure 2A:
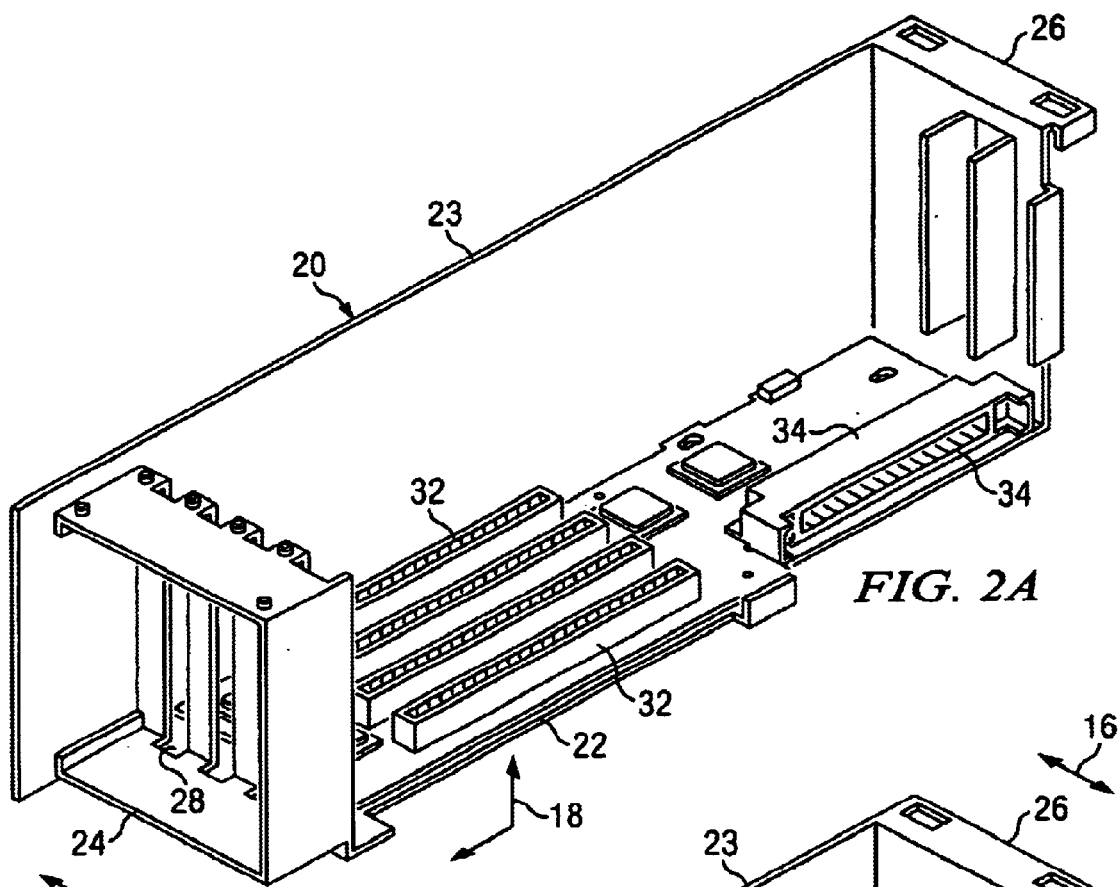
Figure 2B:
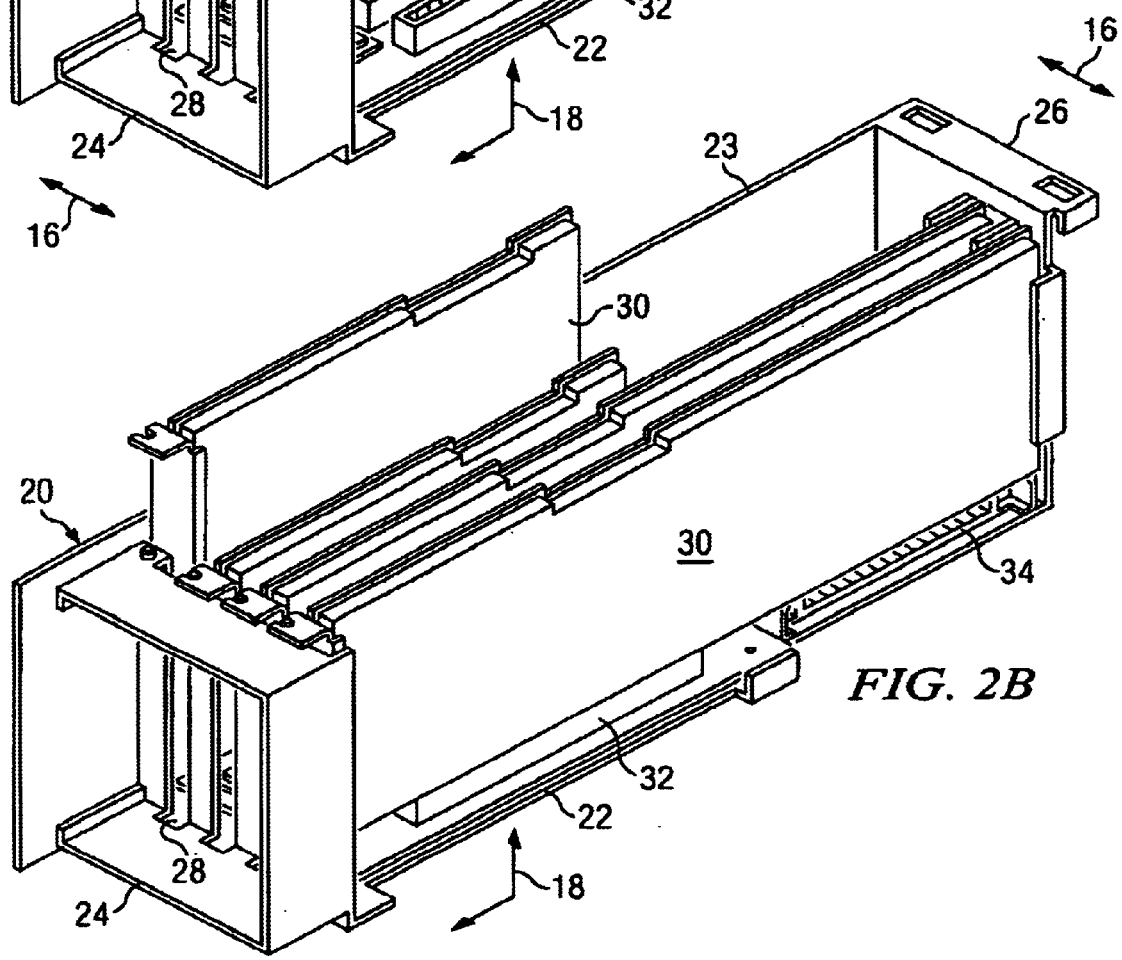

FIGS. 2A–2C are diagrams illustrating an embodiment of a card cage 20 in accordance with the present invention. In the illustrated embodiment, card cage 20 comprises a backplane 22 coupled to and supported by a plurality of sidewalls 23 (a portion of which is partially omitted for ease of illustration and description), and a plurality of bulkheads 24 and 26 for forming a plurality of expansion slots 28 for receiving PCI or expansion cards 30. Bulkheads 24 are sized in the vertical direction to accommodate insertion of card cage 20 into chassis 12. For example, in the illustrated embodiment, bulkheads 24 are sized having a vertical dimension to accommodate insertion of card cage 20 into a 2U rack dimension chassis 12. Expansion cards 30 may comprise any type of card or printed circuit board assembly having varying lengths and/or widths. Each of expansion cards 30 disposed within card cage 20 is adapted to be coupled to a corresponding socket 32 communicatively coupled to backplane 22. Card cage 20 also comprises a connector 34 for providing electrical communication between card cage 20 and motherboard 14 via a connector 36, as best illustrated in FIG. 1, coupled to motherboard 14. Referring to FIG. 2C, card cage 20 may also comprise a cover 38 adapted to secure cards 30 within slots 28. In the illustrated embodiment, cover 38 is rotateably coupled to bulkhead 26 such that cover 38 may be rotated downwardly and secured to bulkhead 24 and/or sidewalls 23 to secure cards 30 within slots 28.

FIG. 3 is a diagram illustrating a profile view of the embodiment of card cage 20 in FIGS. 2A–2C in accordance with the present invention. As illustrated in FIG. 3, backplane 22 comprises four sockets 32 for receiving each of four expansion cards 30. In this embodiment, sockets 32 are selected to optimize the vertical dimension of backplane 22 to accommodate four vertically stacked cards 30. For example, different types of sockets 32 generally have different mounting footprint sizes, thereby requiring varying dimensional mounting areas to be reserved on backplane 22 for each socket 22. Thus, in this embodiment, backplane 22 comprises three surface mount sockets 40 for receiving three corresponding expansion cards 30 and one through-hole mount socket 42 for receiving a remaining expansion card 30. For example, surface mount type sockets generally require a slightly larger mounting area than through-hole type sockets. Therefore, by using at least one through-hole type socket 42, the mounting surface area for sockets 32 is minimized, thereby providing additional mounting area on backplane 22 for receiving a fourth socket 32. However, it should be understood that other types or styles of sockets 32 may also be used on backplane 22 such that sockets 32 are positioned relative to each other to provide required clearances between expansion cards 30 and minimize the size of mounting area required on backplane 22. In the embodiment illustrated in FIG. 3, through-hole mounting socket 42 is illustrated as the uppermost vertically disposed socket 32; however, through-hole mounting type socket 42 may be otherwise located relative to the remaining sockets 40.

As illustrated in FIG. 3, backplane 22 also comprises an interlocking portion 50 adapted to cooperate with a corresponding interlocking portion 52 of motherboard 14, referred to generally in FIG. 1. Referring to FIG. 3, interlocking portion 50 comprises a recessed portion 60 of backplane 22 configured to provide clearance for a corresponding portion of motherboard 14 when card cage 20 is coupled to motherboard 14 within chassis 12. For example, as will be described in greater detail below, interlocking portions 50 and 52 provide corresponding clearances for portions of respective motherboard 14 and backplane 22 to accommodate the vertical dimension of backplane 22 when card cage 20 is coupled to motherboard 14.

Figure 4A:
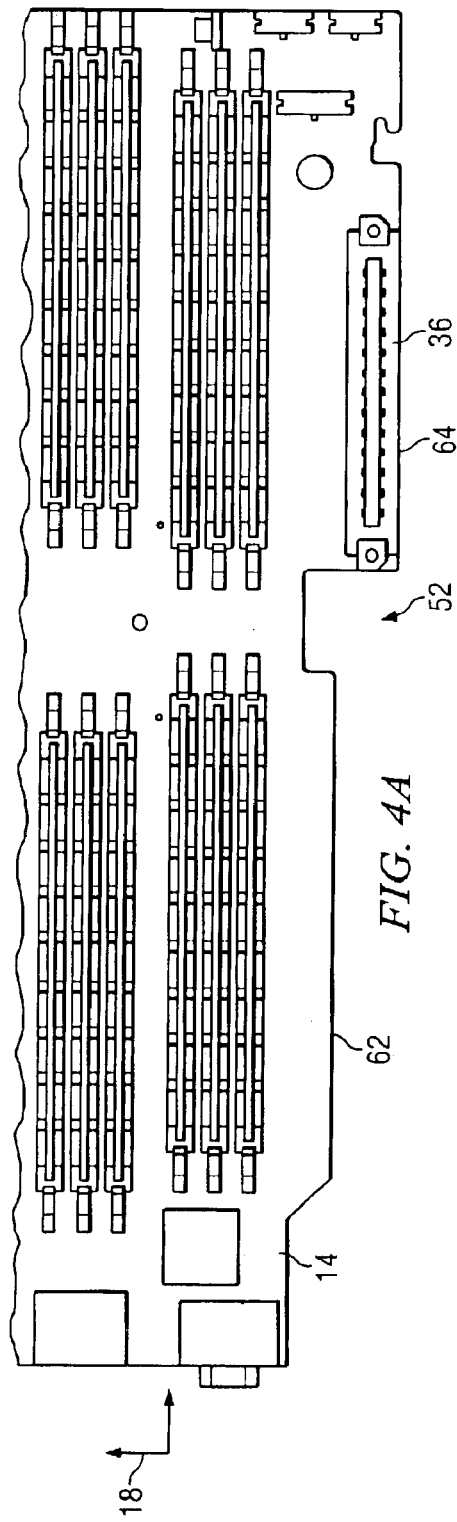
FIGS. 4A and 4B are diagrams illustrating a plan view of the embodiment of the computer rackmount system in FIGS. 1–3.
Figure 4B:
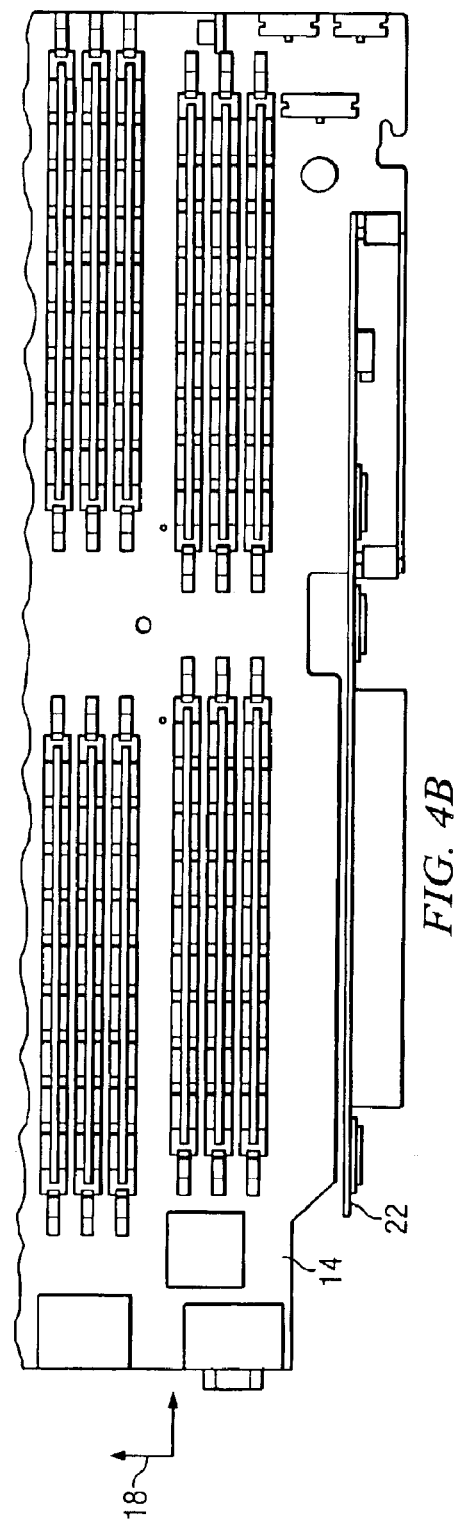

FIG. 4A is a diagram illustrating a plan view of motherboard 14 in accordance with the present invention, and FIG. 4B is a diagram illustrating a plan view of motherboard 14 and vertically oriented backplane 22 coupled to motherboard 14 in accordance with the present invention. Referring to FIG. 4A, interlocking portion 52 of motherboard 14 comprises a recessed portion 62 of motherboard 14 relative to an edge 64 of motherboard 14 to provide clearance for backplane 22. For example, as illustrated in FIG. 4B, backplane 22 is vertically oriented relative to motherboard 14 and coupled to connector 36 to provide electronic communication between motherboard 14 and backplane 22. As will be illustrated in further detail below, recessed portions 60 and 62 cooperate with each other to provide clearance between respective motherboard 14 and backplane 22 portions to accommodate the vertical orientation of backplane 22 relative to motherboard 14 while also accommodating four vertically stacked and horizontally oriented expansion cards 30.

Figure 5:
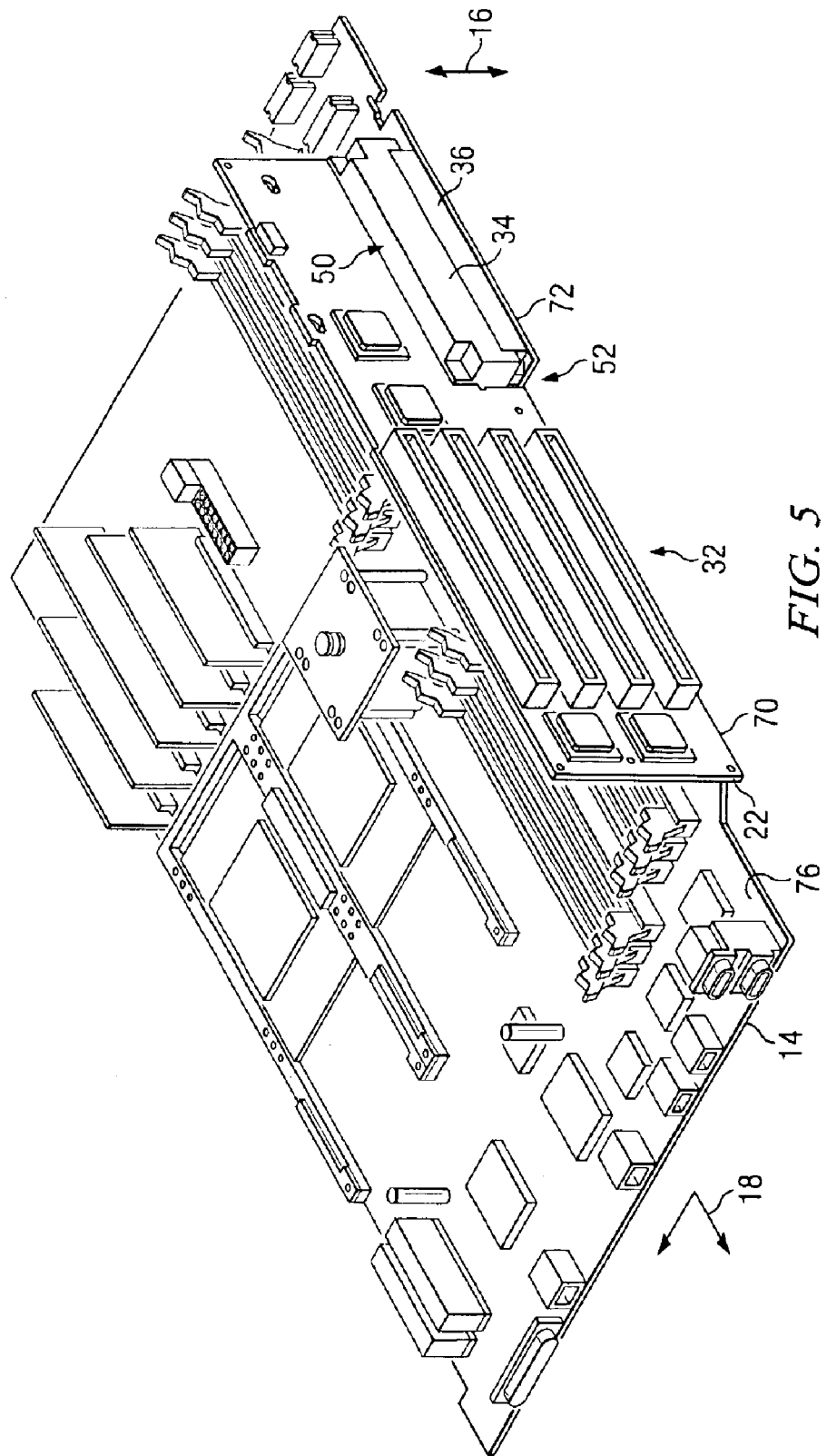
FIG. 5 is a diagram illustrating the embodiment of the rackmount computer system in FIGS. 1–4.

FIG. 5 is a diagram illustrating system 10 in accordance with the present invention. As illustrated in FIG. 5, backplane 22 is vertically disposed relative to motherboard 14 to provide a vertically stacked and horizontally oriented expansion card 30 placement within chassis 12. Interlocking portion 52 of motherboard 14 cooperates with backplane 22 to prevent a lower portion 70 of backplane 22 from interfering with motherboard 14. Additionally, interlocking portion 50 of backplane 22 cooperates with motherboard 14 to prevent interference with a portion 72 of motherboard 14 after placement of card cage 20 within chassis 12. Thus, in operation, interlocking portions 50 and 52 cooperate with each other to provide respective clearances to accommodate a vertically oriented backplane 22 sized to accommodate four vertically stacked and horizontally oriented expansion cards 30 within a 2U rackmount chassis 12. For example, to accommodate the vertical orientation of backplane 22 configured for four vertically stacked and horizontally oriented expansion cards 30, lower portion 70 of backplane 22 extends downwardly into a plane formed by an upper surface 76 of motherboard 14. Thus, to provide clearance for lower portion 70 of backplane 22, recess portion 62 provides clearance for lower portion 70 so that lower portion 70 of backplane 22 may occupy a location in three-dimensional space common to a plane formed by upper surface 76 of motherboard 14. Similarly, recess portion 50 provides clearance to accommodate the coupling of connectors 34 and 36 and to provide clearance for upper portion 76 of motherboard 14 proximate to connectors 34 and 36.

Thus, the present invention provides four vertically stacked and horizontally oriented cards 30 within the size dimensions of a 2U rack. For example, sockets 32 located on backplane 22 of card cage 20 may be selected to minimize mounting area requirements on backplane 22 and provide additional clearance for additional cards 30 on backplane 22. Additionally, according to the present invention, the vertical dimension of backplane 22 is increased to accommodate four vertically stacked and horizontally oriented cards 30 by providing cooperating interlocking portions 50 and 52 on backplane 22 and motherboard 14 to provide required clearances for respective portions of backplane 22 and motherboard 14. The present invention also provides economical and technical advantages by enabling additional cards 30 to be disposed within chassis 12 without requiring multiple riser backplane printed circuit boards. Further, the present invention provides for easy removal and insertion of four expansion cards 30 into chassis 12 by providing a removable card cage 20 as a modular unit that may be easily inserted and removed from chassis 12.

What is claimed is:

1. A rackmount computer system, comprising:
   a 2U rackmount chassis; and
   a card cage adapted to receive at least four vertically stacked horizontally oriented cards, the card cage insertable into the 2U rackmount chassis.

2. The system of claim 1, wherein the rackmount chassis comprises a motherboard adapted to cooperate with a backplane of the card cage.

3. The system of claim 1, wherein a motherboard of the chassis comprises a recessed portion adapted to cooperate with an extension portion of a backplane of the card cage.

4. The system of claim 1, wherein the card cage comprises at least one surface mount socket for receiving one of the cards and at least one through-hole socket for receiving another one of the cards.

5. The system of claim 1, wherein the card cage comprises a vertically oriented backplane adapted to cooperate with a horizontally oriented motherboard of the chassis.

6. The system of claim 1, wherein the card cage comprises a door adapted to secure at least one of the cards with a respective card slot.

7. The system of claim 1, wherein the card cage comprises a vertically oriented backplane adapted to receive each of the cards.

8. A method for providing a rackmount computer system, comprising:
   providing a card cage adapted to receive at least four vertically stacked horizontally oriented cards, the card cage insertable into a 2U rackmount chassis.

9. The method of claim 8, wherein providing a chassis comprises providing a chassis having a motherboard adapted to cooperate with a backplane of the card cage.

10. The method of claim 8, wherein providing a chassis comprises providing a chassis having a motherboard, the motherboard comprising a recessed portion adapted to cooperate with an extended portion of a backplane of the card cage.

11. The method of claim 8, wherein providing a card cage comprises providing a card cage having a vertically-oriented backplane adapted to receive each of the cards.

12. The method of claim 8, wherein providing a card cage comprises providing a card cage having a cover adapted to secure at least one of the cards within a card slot of the card cage.

13. The method of claim 8, wherein providing a card cage comprises providing a card cage having a vertically-oriented backplane adapted to cooperate with a horizontally-oriented motherboard of the chassis.

14. The method of claim 8, wherein providing a card cage comprises providing a card cage having at least one surface mount socket for receiving one of the cards and at least one through-hole socket for receiving another one of the cards.

15. A rackmount computer system, comprising:
   a 2U rackmount support means; and
   a card support means insertable into the 2U rackmount support means, the card support means adapted to receive at least four vertically stacked horizontally oriented cards.

16. The system of claim 15, further comprising means coupled to the card support means adapted to secure at least one of the cards with a card slot of the card support means.

17. The system of claim 15, wherein the rackmount support means comprises a motherboard having an interlocking means formed thereon for cooperating with a backplane of the card support means.

18. The system of claim 15, wherein the card support means comprises a backplane having an interlocking means formed thereon for cooperating with a motherboard of the rackmount support means.

19. The system of claim 15, wherein the card support means comprises at least one surface mount coupling means adapted to receive at least one of the cards and at least one through-hole coupling means adapted to receive another one of the cards.

20. The system of claim 15, wherein the card support means comprises means vertically oriented within the card cage for receiving each of the cards.

21. A computer card cage, comprising:
   a plurality of bulkheads sized to fit vertically within a 2U rackmount chassis; and
   a backplane coupled to the bulkheads and adapted to receive four vertically stacked horizontally oriented cards.

22. The card cage of claim 21, wherein the backplane comprises a recessed portion adapted to cooperate with a corresponding portion of a motherboard of the chassis.

23. The card cage of claim 21, wherein the backplane comprises at least one surface mount socket for receiving one of the cards and at least one through-hole socket for receiving another one of the cards.

24. The card cage of claim 21, further comprising a cover adapted to secure at least one of the cards with a card slot formed by the plurality of bulkheads.

25. The card cage of claim 21, wherein the backplane comprises an interlocking portion adapted to cooperate with a corresponding interlocking portion of a motherboard of the chassis.

26. The card cage of claim 21, wherein the backplane comprises a socket for each of the cards, the sockets selected having dimensional mounting areas sized to accommodate the vertically stacked horizontally oriented cards.

* * * * *